United States Patent
Fu

[11] Patent Number: 5,864,157
[45] Date of Patent: Jan. 26, 1999

[54] FLASH MEMORY WITH IMPROVED PROGRAMMING SPEED

[75] Inventor: Kuan-Yu Fu, Hsinchu, Taiwan

[73] Assignee: United Microelectronics Corp., Hsin-Chu, Taiwan

[21] Appl. No.: 12,960

[22] Filed: Jan. 26, 1998

[30] Foreign Application Priority Data

Dec. 19, 1997 [TW] Taiwan ................................ 86221136

[51] Int. Cl.$^6$ ................................................. H01L 29/788
[52] U.S. Cl. ............................................................ 257/315
[58] Field of Search ................................... 257/315, 318, 257/348

[56] References Cited

U.S. PATENT DOCUMENTS 5,677,876 10/1997 Tanaka .
5,751,631 5/1988 Liu et al. .

*Primary Examiner*—Stephen Meier
*Attorney, Agent, or Firm*—Merchant, Gould, Smith, Edell, Welter & Schmidt, P.A.

[57] ABSTRACT

A flash memory device that can be erased and programmed electrically, the flash memory device includes an array of transistor memory cell units each has N-doped source and drain regions formed in the device substrate. An N-doped buried channel is formed in the device substrate located between the source and drain regions. A P-doped floating gate is further formed substantially above the buried channel, and a control gate is formed on top of the floating gate. The different doping pattern in the buried channel and the floating gate establishes an increased programming bias voltage for the flash device when operating in its programming mode so that programming speed of the device is faster than conventional. The device can also be fabricated in smaller dimensions with improved reliability.

11 Claims, 2 Drawing Sheets

FLASH MEMORY WITH IMPROVED PROGRAMMING SPEED

CROSS-REFERENCE TO RELATED APPLICATION

This application claims the priority benefit of Taiwan application serial no. 86221136, filed Dec. 19, 1997, the full disclosure of which is incorporated herein by reference.

BACKGROUND OF THE INVENTION

1. Field of the Invention

This invention relates in general to the structure of semiconductor integrated circuits (ICs), and in particular to the structure of a flash memory. More particularly, this invention relates to the structural configuration of a flash memory having a buried channel that is capable of improved programming speed.

2. Description of Related Art

Refer to FIG. 1 of the accompanying drawing. Memory cell unit of a conventional flash memory capable of electrical erasure of the memory content thereof is illustrated schematically in the cross-sectional view. An N-channel transistor for the memory cell of the flash device has its $N^+$ (such as $N^+$ polysilicon) gate electrode 130 floating substantially to constitute a surface channel device. The P-type substrate 100 (such as a $P^-$ substrate) has the source region 120 formed as an N-doped region ($N^+$), and the drain region 110 formed as another N-doped region ($N^+$) for the cell transistor. An N-type control gate 140 (such as $N^+$ polysilicon) is formed atop the floating gate 130.

Due to the fact that complementary metal-oxide semiconductor (CMOS) transistors are being widely used in very-large scale integration (VLSI) devices, P-type MOS transistor has become an increasingly important device. However, when designing P-type MOS devices, the doping pattern in the polysilicon gate of the device greatly influences the operating characteristics of the fabricated device.

Thus, in the conventional fabrication technique based on the N-type polysilicon gate, N-type MOS field-effect transistors, hereafter generally referred to as nMOSFET, and pMOSFET are both required to be fabricated by impurity implantation into the P channel of the device so that lower threshold voltage can be used in these VLSI devices. Such implantation fabrication procedures turn pMOSFET into a buried-channel device.

Refer to FIG. 2 of the drawing. A conventional buried-channel pMOSFET 200 has the cross-sectional view illustrating the structural configuration thereof. The buried-channel pMOSFET 200 has an N-doped polysilicon gate 200a formed atop the P-type layer 200b that is used as the implanted and buried P channel.

The structural configuration of the buried-channel pMOSFET similar to the one depicted in FIG. 2 is fabricated in accordance with the structure of the invention to construct the memory cell unit of an electrically erasable and programmable flash memory device.

SUMMARY OF THE INVENTION

It is an object of the invention to provide a structure for a flash memory device transistor memory cell unit capable of providing improved programming speed.

It is another object of the invention to provide a structure for a flash memory device transistor memory cell unit capable of being fabricated into smaller dimensions.

It is yet another object of the invention to provide a structure for a flash memory device transistor memory cell unit that is more reliable while providing faster programming speed and being fabricated into smaller dimension.

The invention achieves the above-identified objects by providing a flash memory device that can be erased and programmed electrically, and the flash memory device includes an array of transistor memory cell units each having N-doped source and drain regions formed in the device substrate. An N-doped buried channel is formed in the device substrate located between the source and drain regions. A P-doped floating gate is further formed substantially above the buried channel, and a control gate is formed on top of the floating gate. The different doping patterns in the buried channel and the floating gate establish an increased programming bias voltage for the flash device when operating in its programming mode so that programming speed of the device is faster than conventional. The device can also be fabricated in smaller dimensions with improved reliability.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
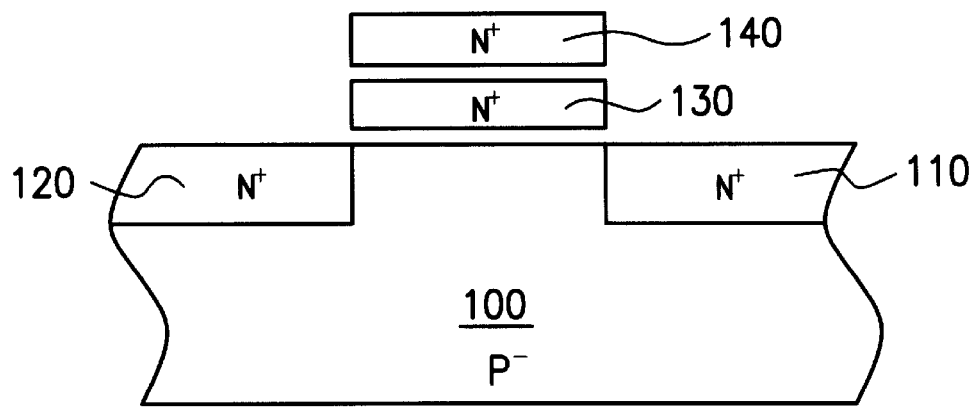
FIG. 1 (Prior Art) schematically shows the cross-sectional view of a conventional floating-gate transistor for the memory cell unit of a flash memory device.
Figure 2:
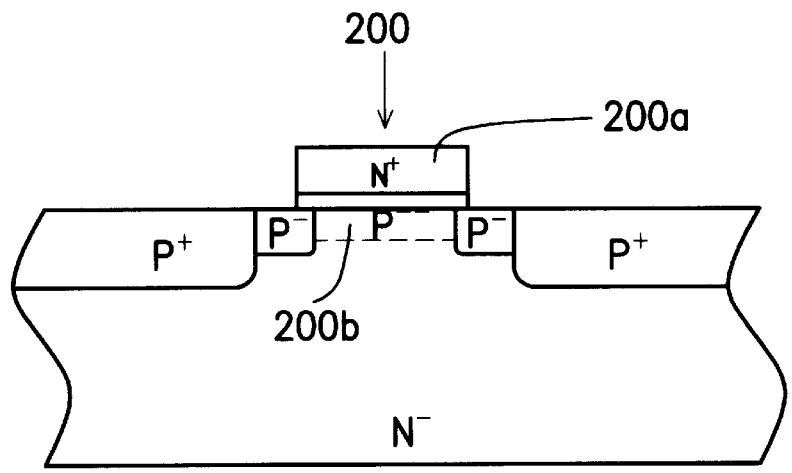
FIG. 2 (Prior Art) schematically shows the cross-sectional view of a conventional buried-channel pMOSFET for the memory cell unit of a flash memory device.
Figure 3:
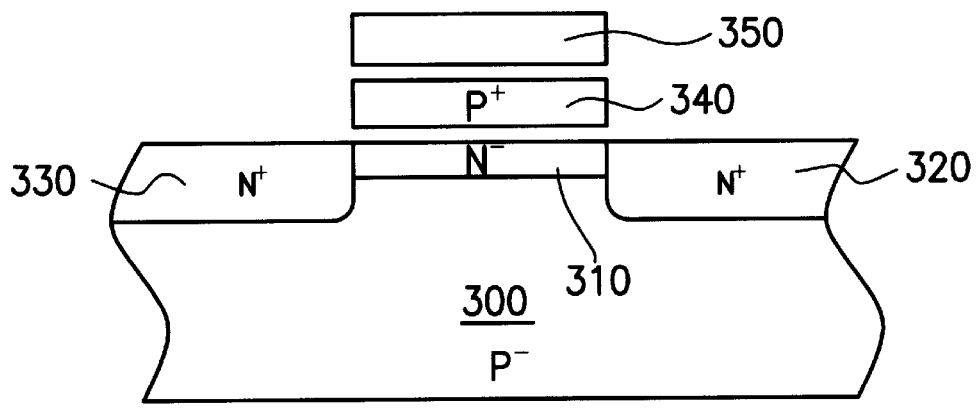
FIG. 3 schematically outlines the structural configuration of a buried-channel device for the memory cell unit of a flash memory device in accordance with a preferred embodiment of the invention.

Refer to FIG. 3 of the drawing. FIG. 3 schematically outlines the structural configuration of a buried-channel device for the memory cell unit of a flash memory device in accordance with a preferred embodiment of the invention. The cross-sectional view shows that the exemplified device has an $N^-$ buried channel 310 formed between the $N^+$ drain 320 and the $N^+$ source 330 regions underneath the surface of the device substrate 300. The device substrate 300, in this case, can be a $P^-$ substrate. A $P^+$ floating gate is formed substantially above the buried channel 310, with a control gate 350 formed further atop, as is schematically illustrated in the drawing.

Thus, a preferred embodiment of the buried-channel transistor for the memory cell unit of flash memory device includes at least a buried channel 310 formed between the source and drain regions of the cell unit transistor. The source and drain regions are formed in the device substrate with the buried channel also formed substantially in the substrate. A floating gate is formed on top of the buried channel, and a control gate is formed further on top of the floating gate.

One preferred embodiment of the buried-channel transistor for the memory cell unit of the flash memory device as outlined above employs a P-doped floating gate. Due to the work function provided by that P-doped material, the inventive memory cell unit can be programmed at a programming bias voltage about 1.4 volts higher than that may be used in the conventional N+ floating gate devices. This increased programming bias voltage allows the inventive flash device to be programmed at a speed about ten times faster than possible in the conventional flash devices.

Figure 4:
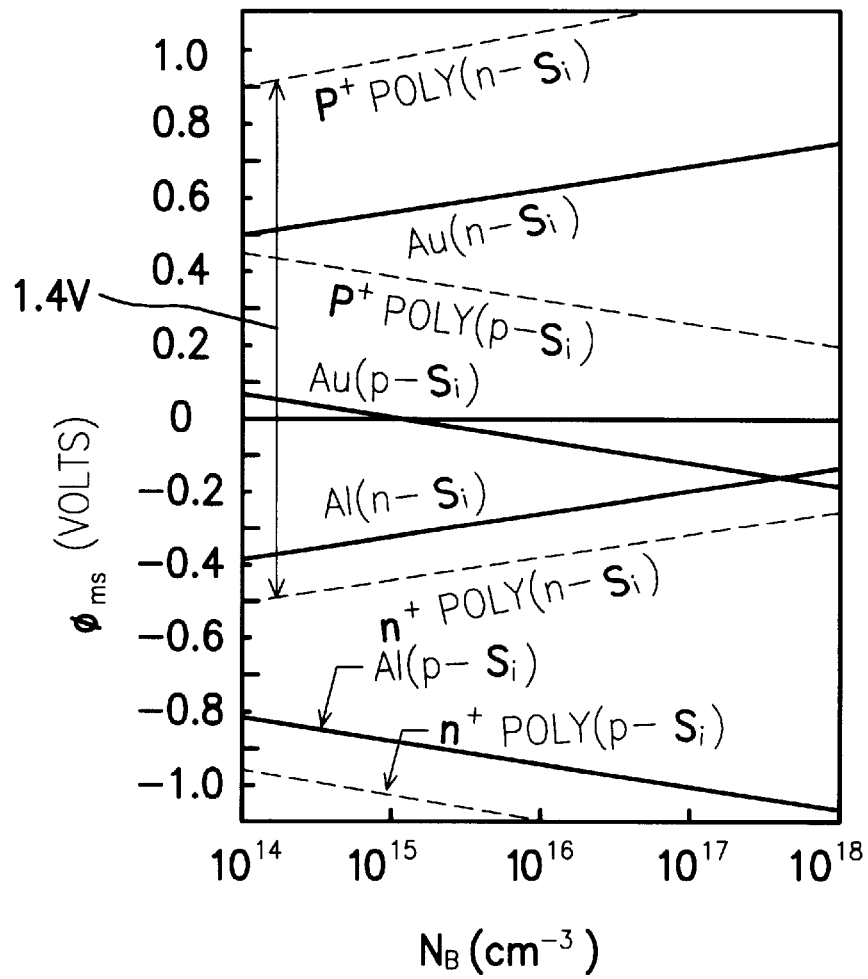
FIG. 4 shows the work function characteristic of the materials used to fabricate the floating gate of the flash memory device of the invention.

FIG. 4 shows the characteristic of the material used to fabricate the floating gate of the inventive memory device has a work function $\phi_{ms}$ that is dependent on the factor of the doping concentration $N_B$. In page 397 of "Physics of Semiconductor Devices" by Sze, it can be shown that the work function difference between the interfaces of P-doped polysilicon/N-type silicon P+ POLY(n-Si) adopted by the invention and that of the conventional N-doped polysilicon/N-type silicon N+ POLY(n-Si) is about at least 1.4 volts. This work function difference between the interfaces is a result of different doping conditions such as concentration and type of impurities employed.

Figure 5:
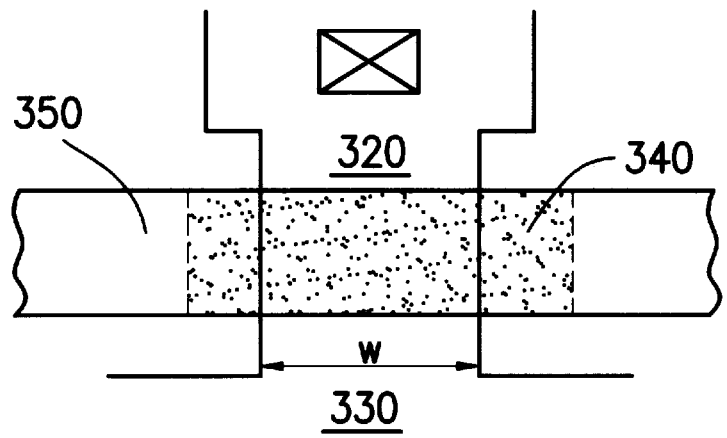
FIG. 5 schematically depicts the top view of the transistor cell unit of the invention featuring a reduced channel width.

Meanwhile, the buried-channel transistor device exemplified above in accordance with the embodiment of the invention provides a buried-channel transistor for the memory cell unit of the flash device that employs N-doped buried channel. This allows a carrier mobility that is about 2 times that of those devices with surface channel. On the other hand, it is possible to maintain suitable memory cell read access current with the reduced channel width w, as outlined in the top view of FIG. 5, in which the top view of the transistor unit of the invention featuring a reduced channel width is outlined. The channel width w, however, must be sufficient to sustain acceptable channel coupling ratio for the constructed device. Thus, the buried-channel transistor device of the invention is capable of providing a flash memory device featuring improved programming speeds while enjoying reduced physical device size. Reduced unit cell size for the flash memory device can be directly translated into the increased memory density of the fabricated device.

Further, under programming mode, the inventive flash memory device employing the buried-channel structural configuration may be less susceptible to the disadvantageous effect of band-to-band tunneling in the drain region of the cell unit transistor. This is advantageous in reducing power consumption in the memory device featuring the buried channel of the invention. There is an additional advantage of the reduced effect of hot carriers in the memory cell unit. This in turn improves the reliability of the flash memory device employing the inventive buried-channel configuration of the invention.

A flash memory device employing a transistor for its memory cell unit with P-type buried channel is equally applicable in providing a flash device that is faster in programming and smaller in dimensions, although the above description has been based on an N-type buried channel. In this device with the reversed polarity arrangement, the transistor unit has a P-type buried channel and an N-type floating gate formed above the channel. Due to the fact that the 1.4 V-or-so work function difference between the interfaces formed in the layers of the device is also present, comparable advantages of this device as that described for the N-type buried-channel one, apparently, need no elaboration herein.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A memory cell unit for flash memory device capable of electrical erasure and programming of memory content thereof, the memory cell unit comprising:

an N-doped source region formed in the device substrate;

an N-doped drain region formed in the device substrate;

an N-doped buried channel formed in the device substrate and between the source and drain regions;

a P-doped floating gate formed substantially above the buried channel; and a control gate formed on top of the floating gate.

2. A memory cell unit for flash memory device capable of electrical erasure and programming of memory content thereof, the memory cell unit comprising an N-channel transistor at least having an N-doped buried channel and a P-doped floating gate.

3. A memory cell unit for flash memory device capable of electrical erasure and programming of memory content thereof, the memory cell unit comprising an N-channel transistor at least having a P-doped floating gate.

4. The memory cell unit for flash memory device of claim 3, wherein the memory cell further comprises an N-doped buried channel.

5. A memory cell unit for flash memory device capable of electrical erasure and programming of memory content thereof, the memory cell unit comprising a N-channel transistor at least having an N-doped buried channel.

6. The memory cell unit for flash memory device of claim 5, wherein the memory cell further comprises a P-doped floating gate.

7. A memory cell unit for flash memory device capable of electrical erasure and programming of memory content thereof, the memory cell unit comprising a buried channel of a first conducting type and a floating gate of a second conducting type different from the first.

8. The memory cell unit for flash memory device of claim 7, wherein the first conducting type is P type and the second conducting type is N type.

9. The memory cell unit for flash memory device of claim 7, wherein the first conducting type is N type and the second conducting type is P type.

10. A flash memory device capable of electrical erasure and programming of memory content thereof, the flash memory device including a plurality of transistor memory cell units each comprising:

an N-doped source region formed in the device substrate;

an N-doped drain region formed in the device substrate;

an N-doped buried channel formed in the device substrate and between the source and drain regions;

a P-doped floating gate formed substantially above the buried channel; and a control gate formed on top of the floating gate.

11. A flash memory device capable of electrical erasure and programming of memory content thereof, the flash memory device including a plurality of transistor memory cell units each comprising:

a P-doped source region formed in the device substrate;

a P-doped drain region formed in the device substrate;

a P-doped buried channel formed in the device substrate and between the source and drain regions;

an N-doped floating gate formed substantially above the buried channel; and a control gate formed on top of the floating gate.

* * * * *